(12) United States Patent
Qu et al.

(10) Patent No.: US 9,306,044 B2
(45) Date of Patent: Apr. 5, 2016

(54) SEMICONDUCTOR CONFIGURATION HAVING REDUCED ON-STATE RESISTANCE

(75) Inventors: Ning Qu, Reutlingen (DE); Alfred Goerlach, Kusterdingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 120 days.

(21) Appl. No.: 13/982,430

(22) PCT Filed: Dec. 2, 2011

(86) PCT No.: PCT/EP2011/071590
§ 371 (c)(1),
(2), (4) Date: Oct. 7, 2013

(87) PCT Pub. No.: WO2012/103968
PCT Pub. Date: Aug. 9, 2012

(65) Prior Publication Data
US 2014/0021509 A1    Jan. 23, 2014

(30) Foreign Application Priority Data

Feb. 1, 2011   (DE) .......................... 10 2011 003 456

(51) Int. Cl.
| | |
|---|---|
| H01L 29/739 | (2006.01) |
| H01L 29/06 | (2006.01) |
| H01L 29/78 | (2006.01) |
| H01L 29/861 | (2006.01) |

(52) U.S. Cl.
CPC ........ *H01L 29/7393* (2013.01); *H01L 29/0623* (2013.01); *H01L 29/7395* (2013.01); *H01L 29/7397* (2013.01); *H01L 29/7802* (2013.01); *H01L 29/7813* (2013.01); *H01L 29/861* (2013.01)

(58) Field of Classification Search
CPC .................................................. H01L 29/7813
See application file for complete search history.

(56) References Cited

U.S. PATENT DOCUMENTS

| 4,434,433 | A | * | 2/1984 | Nishizawa ............. G11C 11/35 257/264 |
|---|---|---|---|---|
| 6,037,632 | A | | 3/2000 | Omura et al. |
| 6,621,121 | B2 | | 9/2003 | Baliga |

(Continued)

FOREIGN PATENT DOCUMENTS

| CN | 101180737 | 5/2008 |
|---|---|---|
| DE | 10 2009 000 135 | 9/2009 |

(Continued)

OTHER PUBLICATIONS

International Search Report, PCT International Application No. PCT/EP2011/071590, dated Apr. 23, 2012.

*Primary Examiner* — Thao X Le
*Assistant Examiner* — Geoffrey Ida
(74) *Attorney, Agent, or Firm* — Kenyon & Kenyon LLP

(57) ABSTRACT

A semiconductor configuration, which includes an epitaxial layer of the first conductivity type disposed on a highly doped substrate of first conductivity type; a layer of a second conductivity type introduced into the epitaxial layer; and a highly doped layer of the second conductivity type provided at the surface of the layer of the second conductivity type. Between the layer of the second conductivity type and the highly doped substrate of the first conductivity type, a plurality of Schottky contacts, which are in the floating state, are provided mutually in parallel in the area of the epitaxial layer.

9 Claims, 4 Drawing Sheets

(56) References Cited

U.S. PATENT DOCUMENTS

| | | |
|---|---|---|
| 7,714,365 B2 | 5/2010 | Werner |
| 2002/0005549 A1* | 1/2002 | Saito et al. ............ 257/328 |
| 2002/0047124 A1* | 4/2002 | Kitabatake .............. 257/73 |
| 2002/0179925 A1* | 12/2002 | Tihanyi ................. 257/107 |
| 2003/0020134 A1 | 1/2003 | Werner et al. |
| 2003/0042555 A1 | 3/2003 | Kitada et al. |
| 2005/0167742 A1 | 8/2005 | Challa et al. |
| 2006/0214222 A1* | 9/2006 | Challa et al. ........... 257/328 |
| 2005/0501677 | 8/2009 | Werner |

FOREIGN PATENT DOCUMENTS

| | | |
|---|---|---|
| JP | 09191109 | 7/1997 |
| JP | 2007529115 | 10/2007 |

* cited by examiner

SEMICONDUCTOR CONFIGURATION HAVING REDUCED ON-STATE RESISTANCE

FIELD

The present invention relates to a semiconductor configuration having reduced on-state resistance.

BACKGROUND INFORMATION

FIG. 1 shows a simplified cross section of a configuration of a trench MOS. Disposed on a highly $n^+$-doped silicon substrate 1 is an n-doped silicon layer 2 (epitaxial layer), into which a multiplicity of trenches 3 is introduced, only one trench being shown exemplarily in FIG. 1. Disposed at the side walls and at the bottom of the trenches in each case is a thin dielectric layer 4, mostly made of silicon dioxide. The inside of the trenches is filled with a conductive material 5, for example, doped polysilicon. Disposed between the trenches is a p-doped layer (p-well) 6. Highly $n^+$-doped regions 8 (source) and highly $p^+$-doped regions 7 (for connecting the p-well) are introduced into this p-doped layer at the surface. The surface of the entire structure is covered with a conductive layer 9, for example, with aluminum, which forms an ohmic contact with the $p^+$-, respectively $n^+$-doped layers 7 and 8. A thick dielectric layer 10, for example, a CVD oxide layer, insulates the conductive polysilicon layer 5 from metallization 9. Polysilicon layers 5 are galvanically connected to one another and to a metallic gate contact (not drawn). To this end, dielectric layer 10 and metal layer 9 are open at one location. Another island-shaped metal layer (not drawn), which is electrically insulated from metallization layer 9, is applied over polysilicon layer 5 in this metal opening. It contacts polysilicon layer 5 and is used as a gate terminal.

A metallization layer 11 is likewise located on the rear side of the chip. It forms the electrical contact to highly $n^+$-doped silicon substrate 1. Metal layer 9 forms source contact S; metal layer 11, drain contact D; and island-shaped metal layer (not shown), gate contact G. Metallization 9, respectively the island-shaped metal layer can be an aluminum alloy that is customary in silicon technology having copper and/or silicon contents or some other metal system. On the rear side, a solderable metal system 11 is applied, composed, for example, of a layer sequence of Ti, NiV and Ag.

Drain contact 11 is normally at a positive potential, while the source terminal is at ground potential. If, relative to the source contact, a high enough positive gate voltage VG is applied to the gate terminal, a thin electron inversion channel forms in body region 6 at the boundary surface to gate oxide 4. In this context, gate voltage VG must be higher than threshold voltage VTH of the transistor. The inversion channel extends from $n^+$-doped source region 8 to n-doped epitaxial region 2. Thus, a continuous electron path is created from the source contact to the drain contact. The transistor is conductive.

Since the current flow occurs only through majority carriers, which are electrons, it can be quickly interrupted. In contrast to conventional bipolar components, the component switches very rapidly.

The doping concentration and thickness of n-doped region (epitaxial layer) 2 is determined by the blocking voltage of the transistor. The higher the blocking voltage of a MOSFET is selected, the more weakly doped and thicker region 2 must be. Since an ohmic voltage drop develops across the epitaxial region, the entire on-state resistance Rdson thereby increases. At high blocking voltages, this component dominates. Therefore, MOSFETs are generally not suited for blocking voltages over 200 V.

A vertical MOSFET, which exhibits a reduced on-state resistance, is described in U.S. Pat. No. 6,621,121 B2. This MOSFET includes a semiconductor substrate having a plurality of semiconductor mesas that are mutually separated by a plurality of strip-shaped trenches. These trenches extend mutually in parallel and, in a first direction, transversely across the substrate. Moreover, the MOSFET has a plurality of hidden, insulated source electrodes configured within the plurality of strip-shaped trenches. In addition, the MOSFET includes a plurality of insulated gate electrodes that extend mutually in parallel over the plurality of semiconductor mesas into the flat trenches which are provided in the mentioned multiplicity of hidden, insulated source electrodes. Moreover, the MOSFET has a surface source electrode on the mentioned semiconductor substrate that is electrically contacted by the plurality of hidden, insulated source electrodes and has an ohmic contact with the at least one base region in each of the plurality of semiconductor mesas.

SUMMARY

An example semiconductor configuration in accordance with the present invention may have the advantage of being simple to realize, and, besides reducing the on-state resistance, of also making it possible to expand the blocking voltage range, and of also being especially suited for majority carrier components. A semiconductor configuration in accordance with the present invention features a plurality of floating Schottky contacts that are provided in the area of the epitaxial region of the semiconductor configuration. A floating Schottky contact is understood in this context to be a Schottky contact whose Schottky metal does not have any galvanic connection to other contacts.

As a result of this plurality of floating Schottky contacts, a periodically homogeneous field distribution, as well as a virtually linear voltage distribution are obtained in each of the epitaxial layers. The doping concentration of the epitaxial layers for a predefined breakdown voltage may be selected to be higher than in the case of the known MOSFETS. The on-state resistance is thereby reduced.

Exemplary embodiments of a semiconductor configuration in accordance with the present invention are clarified in greater detail below reference to FIGS. 2-8.

DETAILED DESCRIPTION OF EXAMPLE EMBODIMENTS

Figure 2:
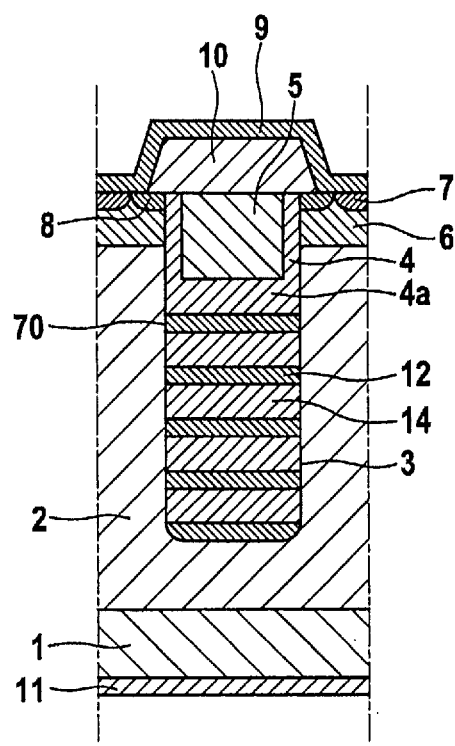
FIG. 2 shows a sectional view of a cell of a MOSFET in accordance with a first exemplary embodiment of the present invention.

FIG. 2 shows a sectional view of a cell of a MOSFET in accordance with a first exemplary embodiment of the present invention. The MOSFET has a plurality of these types of cells that are disposed mutually in parallel, each of these cells extending in one direction orthogonally to the drawing plane.

The illustrated MOSFET includes a highly n$^+$-doped silicon substrate 1, an n-doped silicon layer 2 (epitaxial layer) disposed thereabove, into which a plurality of trenches 3 is introduced. Trenches 3 preferably have a square shape or a U-shape or a shape similar thereto. Trenches 3 may be disposed in a strip-type configuration or in the form of islands, the islands being circular or hexagonal, for example. Trenches 3 are preferably produced by etching into epitaxial layer 2. Disposed at the side walls of the trenches in the upper part is a thin dielectric layer 4, mostly made of silicon dioxide. Within the trenches, a region of a conductive material 5, for example, doped polysilicon, is contiguous to the side walls. Oxide layer 4 extends to underneath region 5, but is configured to be somewhat thicker there (region 4a). Disposed between the trenches is a p-doped layer (p-well) 6. Highly n$^+$-doped regions 8 (source) and highly p$^+$-doped regions 7 (for electrically connecting the p-well) are introduced into this p-doped layer at the surface. The surface of the entire structure is covered with a conductive layer 9, for example, with aluminum, which forms an ohmic contact with p$^+$-, respectively n$^+$-doped layers 7 and 8. A thick dielectric layer 10, for example, a CVD oxide layer, insulates conductive polysilicon layer 5 from metallization 9. Polysilicon layers 5 are galvanically connected to one another and to a metallic gate contact (not shown). Likewise disposed on the rear side of the chip is a metallization layer 11 that forms the electrical contact to highly n$^+$-doped silicon substrate 1. Metal layer 9 forms source contact; metal layer 11, drain contact; and island-shaped metal layer (not shown), gate contact of the MOSFET.

Figure 1:
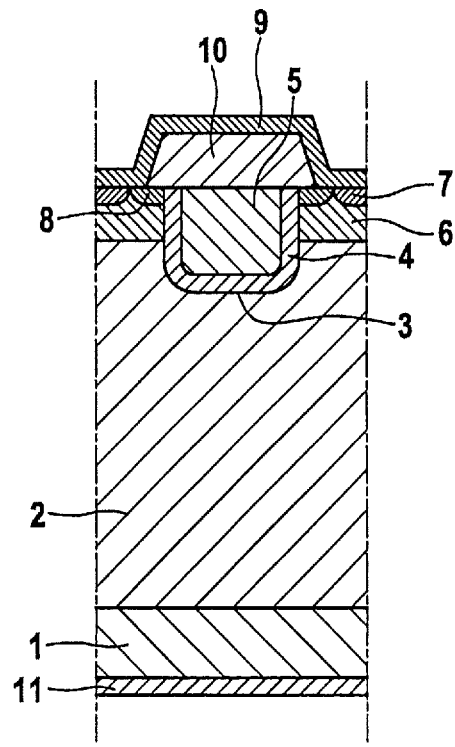
FIG. 1 shows a cross section of a trench MOS.

In contrast to the configuration shown in FIG. 1, trench regions 3 do not end with oxide layer 4, respectively 4a; rather, below 4a, other alternating layers, in the case of which Schottky metal 12 and other oxide layers 14 alternate, are configured. Schottky metals are understood in this context to be all metals and all silicides that form a (non-ohmic) Schottky contact 70 with contiguous n-doped regions 2 on both sides. Material 12 may be nickel or NiSi, for example. In the illustrated example, five floating Schottky layers 12 are disposed underneath oxide region 4a, which, in turn, are each insulated from one another by a dielectric layer 14. The last floating Schottky contact covers the trench bottom. It is self-evident that Schottky layers 12 are also provided that are floating to a greater or lesser extent.

Figure 3:
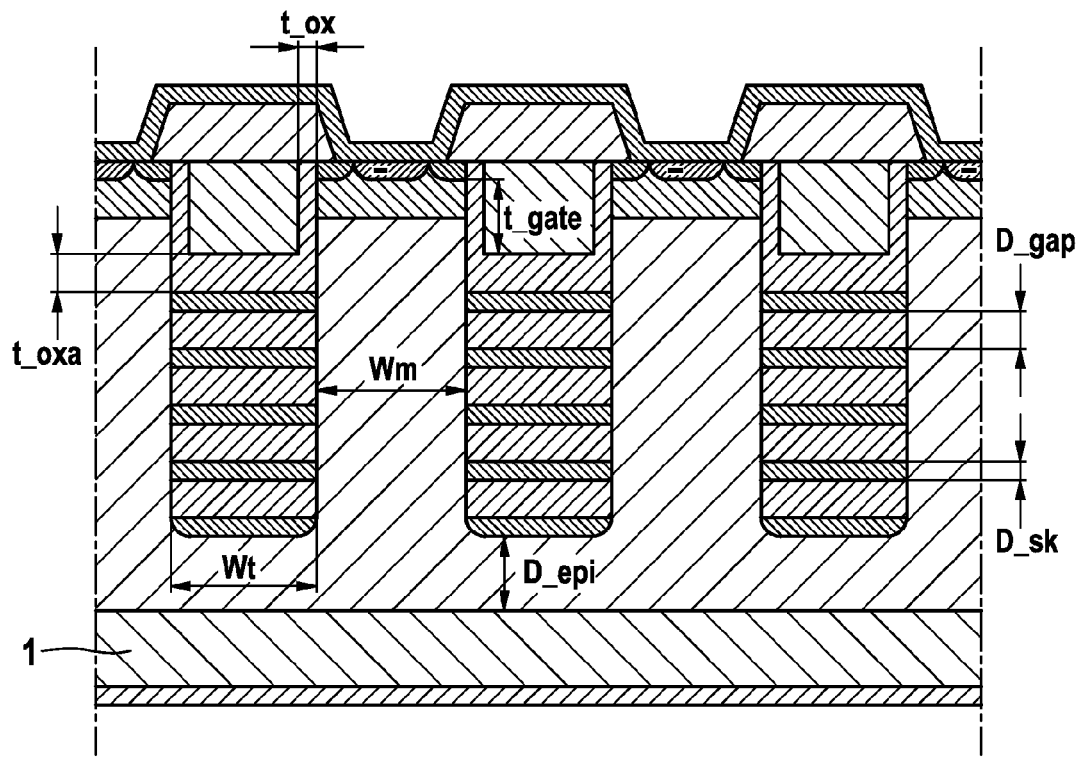
FIG. 3 shows a sectional view of a MOSFET in accordance with the first exemplary embodiment illustrating three cells of the MOSFET.

FIG. 3 shows a sectional view of a MOSFET in accordance with the first exemplary embodiment illustrating three adjacent cells of the MOSFET. From FIG. 3, it is apparent that trenches 3 etched into n-epitaxial layer 2 have a width Wt and a distance D_epi to n$^+$-substrate 1. The distance of the mesa regions between adjacent trenches 3 is Wm. Schottky contacts 12 each have a thickness D_sk and are placed at a distance D_gap from one another. D_gap corresponds to the thickness of oxide layers 14 (see FIG. 2). The thickness of gate oxide 4 is t_ox and that of lower, thicker oxide, t_oxa.

The number of floating Schottky regions 12 is Z. In the illustrated example, Z is selected to =5.

Given a high enough positive gate voltage VG (greater than threshold voltage VTH), the MOSFET is switched on. An electron stream flows from source region 8 via the inversion channel in p-region 6 to epitaxial, respectively substrate region 2, respectively 1.

In the blocking direction, a space charge zone forms in n-epitaxial layer 2 located underneath body region 6. The space charge zone expands in response to increasing voltage in the direction of substrate 1. In the case that space charge zone reaches first floating Schottky contact at a voltage V1, this voltage V1 is received by first floating Schottky contact. The space charge zone expands in response to increasing voltage in the direction of the trench bottom, respectively substrate. The voltage at the first floating Schottky contact remains unchanged.

Analogously, at a higher voltage Vn, the space charge zone reaches the n-th floating Schottky contact. The n-th floating Schottky contact receives voltage Vn. In response to further increasing voltage, the voltage at n-th floating Schottky contact remains unchanged.

Figure 4:
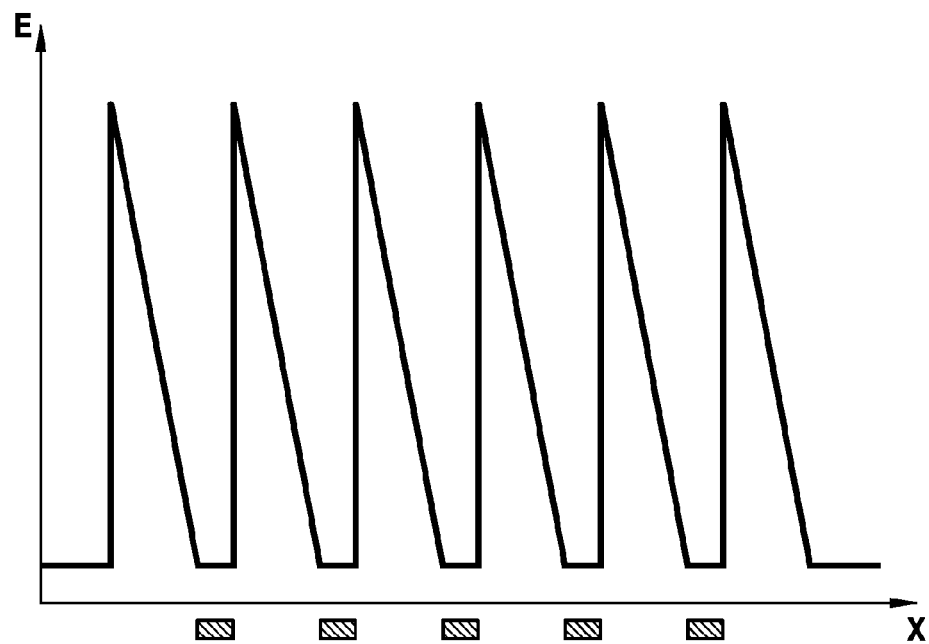
FIG. 4 shows a diagram for illustrating the distribution of the electrical field at breakdown of a MOSFET in accordance with the first exemplary embodiment in the region of a mesa strip.

In the case that width D_sk and distance D_gap are selected to be the same in the structure of the MOSFETs for all Schottky contacts 12, a periodically homogeneous field distribution is present in the mesa region (distance Wm) of region 2. This field distribution is illustrated in FIG. 4, in which path X is plotted along the abscissa in the mesa region along the trenches in the direction of substrate 1, and electrical field strength E is plotted along the ordinate. The rectangles underneath abscissa X symbolize the position of the floating Schottky contacts. It is apparent that the field distribution is repeated in the mesa region following a distance (D_sk+D_gap) until the trench bottom is reached.

Figure 5:
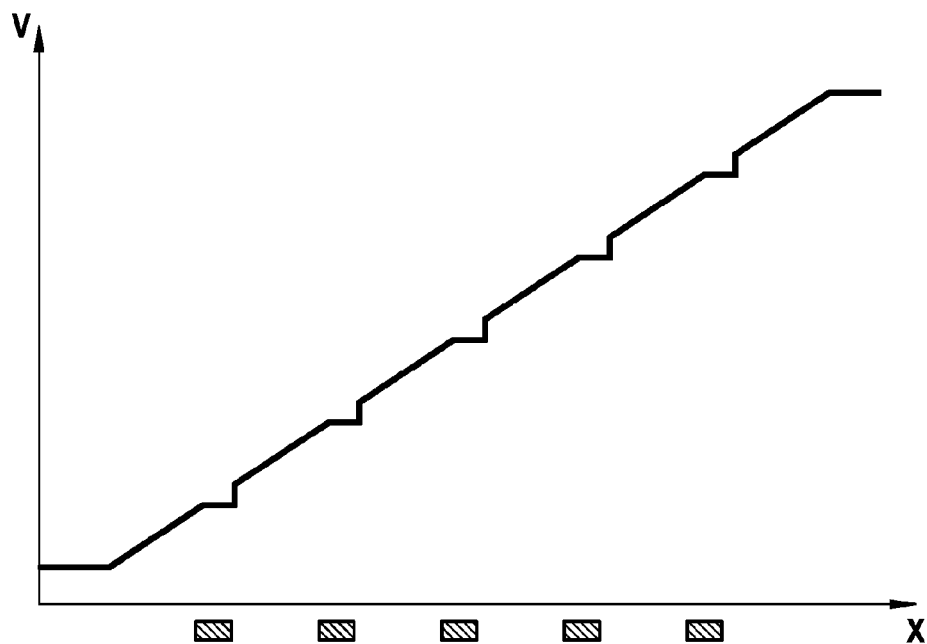
FIG. 5 shows a diagram for illustrating the voltage distribution at breakdown of a MOSFET in accordance with the first exemplary embodiment in the region of a mesa strip.

FIG. 5 shows a diagram of the corresponding voltage distribution in the mesa region, the rectangles underneath abscissa X symbolizing the position of the floating Schottky contacts in FIG. 5 as well. It is apparent that the voltage distribution in the mesa regions is linear in each case. There are short regions of constant voltage merely in the area of the Schottky contacts.

In contrast to conventional configurations, the blocking voltage increases in response to increasing number Z of floating Schottky contacts 12. A higher blocking voltage is thereby achieved, respectively, given a comparable blocking voltage, a higher doping of epitaxial region 2 may be selected. The ohmic voltage drop is thereby reduced in the ON state of the semiconductor configuration. The on-state resistance Rdson decreases. It is thus possible to dimension trench MOSFETs for higher blocking voltages at a low on-state resistance.

Figure 6:
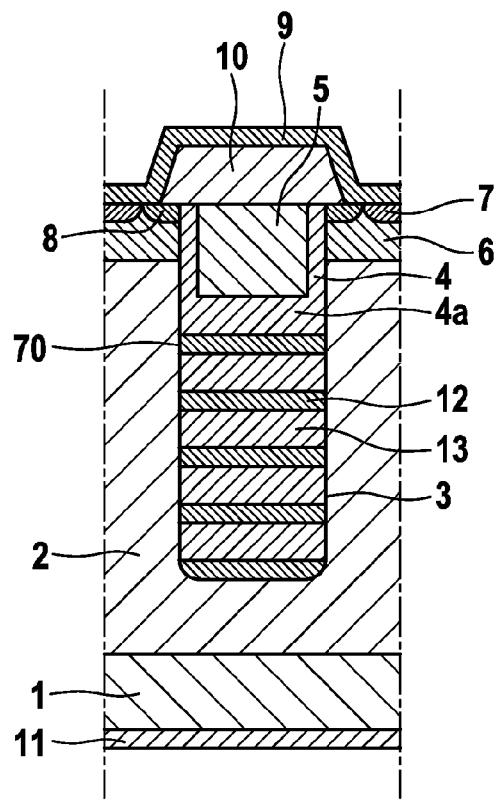
FIG. 6 shows a sectional view of a MOSFET in accordance with a second exemplary embodiment of the present invention.

FIG. 6 shows a sectional view of a cell of a MOSFET in accordance with a second exemplary embodiment of the present invention. The design of this MOSFET conforms with that of the MOSFET described with reference to FIG. 2. The MOSFET illustrated in FIG. 6 differs from that shown in FIG. 2 merely in that oxide layers 14 provided in the case of the MOSFET in accordance with FIG. 2 are replaced by n-doped polysilicon layers or by silicon layers 13. The doping of layers 13 preferably corresponds to that of n-epitaxial layer 2. In place of oxide layers 14, other dielectric materials, such as $Si_3N_4$, SON or $HfO_2$, may also be used, for example.

Alternatively to the exemplary embodiments described above, which each relate to MOSFETs provided with trenches, the principle according to the present invention may also be applied using stacked, floating Schottky contacts for other semiconductor configurations as well, for example, for DMOS transistors or for IGBTs. In the following, the principle according to the present invention is described with reference to the example of a high-blocking p-n diode.

Figure 7:
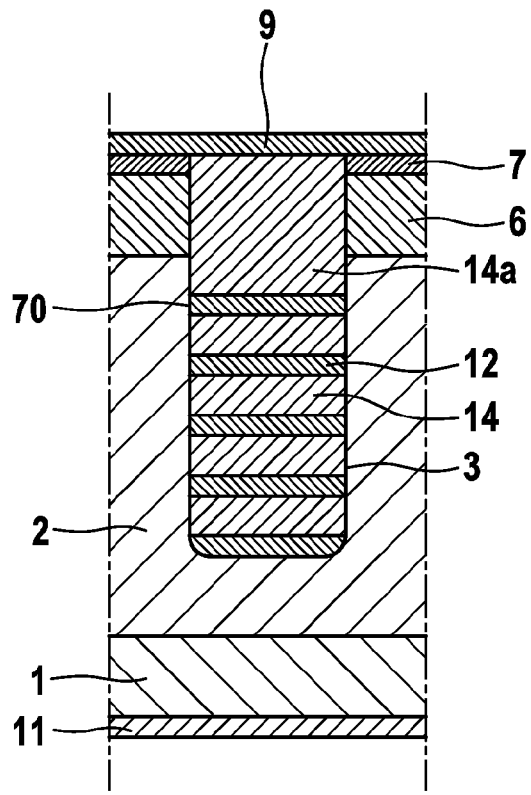
FIG. 7 shows a sectional view of a cell of a p-n diode as a third exemplary embodiment of the present invention.

FIG. 7 shows a sectional view of a cell of a p-n diode as a third exemplary embodiment of the present invention. This p-n diode includes a highly $n^+$-doped silicon substrate 1 and an n-doped silicon layer 2 (epitaxial layer) disposed thereabove, into which a plurality of trenches 3 is introduced. Disposed between the trenches is a p-doped layer (p-well) 6. A highly $p^+$-doped region 7 for electrically connecting p-doped region 6 is introduced into this p-doped layer 6 at the surface thereof. The surface of the entire structure is covered with a conductive layer 9, for example, with aluminum. Together with highly $p^+$-doped region 7, this conductive layer 9 forms an ohmic contact. Likewise disposed on the rear side of the chip is a metallization layer 11 that forms the electrical contact to highly $n^+$-doped silicon substrate 1.

In this exemplary embodiment as well, trenches 3 are filled with a sequence of dielectric layers 14a, respectively 14 and floating Schottky contacts 12, respectively 70. P-doped layer 6 and weakly $n^+$-doped region 2 form the p-n junction of the diode. At the surface thereof, p-doped region 6 is provided with a highly $p^+$-doped layer 7. Analogously to the mode of operation described above, the blocking voltage may be selected to be higher using a structure of this kind than in the case of a usual p-n diode that does not feature this structure. Alternatively, the doping of $n^+$-doped region 2 may be increased and thus the path resistance reduced.

Analogously to the exemplary embodiment in accordance with FIG. 6, dielectric layers 14 may be replaced by suitable n-doped polysilicon layers or silicon layers 13.

Figure 8:
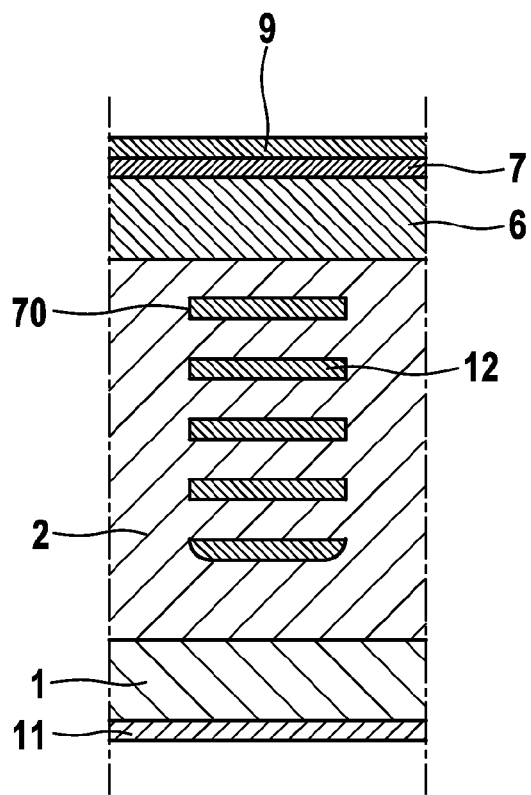
FIG. 8 shows a sectional view of a cell of a p-n diode as a fourth exemplary embodiment of the present invention.

FIG. 8 shows a sectional view of a cell of a p-n diode as a fourth exemplary embodiment of the present invention.

This p-n diode also contains a highly $n^+$-doped silicon substrate 1 and an n-doped silicon layer 2 (epitaxial layer) located thereabove (epitaxial layer). Located above n-doped silicon substrate 2 is a p-doped silicon layer 6. A highly $p^+$-doped layer 7 for electrically connecting the p-doped layer is introduced into this p-doped layer 6 at the surface thereof. The surface of the entire structure is covered with a conductive layer 9, for example, with aluminum. Together with highly $p^+$-doped region 7, this conductive layer 9 forms an ohmic contact. Likewise disposed on the rear side of the chip is a metallization layer 11 that forms the electrical contact to the highly $n^+$-doped silicon substrate.

In contrast to the configuration in accordance with FIG. 7, the configuration shown in FIG. 8 does not have any trenches. Floating Schottky contacts 70, 12 are located within n-doped region 2, so that a region of n-doped region 2 is disposed between two adjacent Schottky contacts. Planar p-doped layer 6 and weakly $n^+$-doped region 2 form the p-n junction of the diode. Planar p-doped layer 6 is provided at the surface thereof with the likewise planar, highly $p^+$-doped layer 7. Analogously to the mode of operation described above, the blocking voltage may be selected to be higher using a structure of this kind than in the case of a usual p-n diode that does not have this structure. Alternatively, the doping of $n^+$-doped region 2 may be increased and thus the path resistance reduced.

In all of the exemplary embodiments described above, the semiconductor configurations may have a solderable front- and rear-side metallization, which allows them to be readily soldered in, respectively contacted in a suitable circuit environment. The described semiconductor configurations in accordance with FIGS. 7 and 8 (diodes) are then mounted in each case in a press-in diode housing. One preferred application of a semiconductor configuration in accordance with the present invention is a use in a rectifier of a motor vehicle generator.

Alternatively to the exemplary embodiments described above, all semiconductor layers may each be replaced by a semiconductor layer of an opposite conductivity type, and the designations of the source and drain connections, respectively the anode and cathode connections may be interchanged.

What is claimed is:

1. A semiconductor configuration, comprising:
   an epitaxial layer of a first conductivity type disposed on a highly doped substrate of the first conductivity type;
   a layer of a second conductivity type introduced into the epitaxial layer;
   a highly doped layer of the second conductivity type provided at a surface of the layer of the second conductivity type; and
   a plurality of floating Schottky contact metal layers provided vertically stacked in at least one trench region and disposed mutually in parallel and parallel to the highly doped substrate, and configured between the layer of the second conductivity type and the highly doped substrate of the first conductivity type, wherein each floating Schottky contact metal layer is isolated from one another by at least one intervening dielectric layer, and wherein each floating Schottky contact metal layer at least laterally contacts the epitaxial layer of the first conductivity type to form a non-ohmic Schottky contact;
   wherein, at the surface of the layer of the second conductivity type, a highly doped layer of the first conductivity type and a highly doped layer of the second conductivity type are provided, at least two trenches filled with doped polysilicon and covered with dielectric layers are introduced into the epitaxial layer, the dielectric layers forming bottoms of the trenches are dimensioned to be thicker than the dielectric layers at side walls of the trenches, and an alternating sequence of the floating Schottky contact metal layers and the at least one intervening dielectric layer is provided below the dielectric layer forming the bottom of the respective trench.

2. The semiconductor configuration as recited in claim 1, wherein the Schottky contact metal layer of the alternating sequence most proximate to the highly doped substrate of the first conductivity has a distance to the highly doped substrate of the first conductivity type.

3. The semiconductor configuration as recited in claim 1, wherein the floating Schottky contact metal layers each have a width, and the dielectric layers provided between the Schottky contact metal layers each have a width.

4. The semiconductor configuration as recited in claim 3, wherein, between adjacent trenches of the semiconductor configuration, a mesa region is present in each case, in which a field distribution is periodically repeated at a distance, for which it holds that:

$$D=D\_sk+D\_gap,$$

D_sk being the width of the floating Schottky contact metal layers, and D_gap being the width of the further dielectric layers.

5. The semiconductor configuration as recited in claim 4, wherein a voltage distribution in mesa regions is linear in each case.

6. The semiconductor configuration as recited in claim 1, wherein at least two trenches filled with a dielectric layer are introduced into the epitaxial layer, a distance of the dielectric layers from the highly doped substrate of the first conductivity type is smaller than a distance of the layer of the second conductivity type from the highly doped substrate of the first conductivity type, and an alternating sequence of the floating Schottky contact metal layers and the at least one intervening dielectric layer is provided in each case between (i) the dielectric layer forming the bottom of the respective trench and facing the highly doped substrate of the first conductivity type and (ii) the highly doped substrate of the first conductivity type.

7. The semiconductor configuration as recited in claim 1, wherein the Schottky contact metal layers which are disposed mutually in parallel, are located one of underneath a body diode of a DMOS transistor or underneath the body diode of an IGBT.

8. The semiconductor configuration as recited in claim 1, further comprising:
   a solderable front-side metallization and a solderable rear-side metallization.

9. A rectifier of a motor vehicle generator, the rectifier including a semiconductor configuration including an epitaxial layer of a first conductivity type disposed on a highly doped substrate of the first conductivity type, a layer of a second conductivity type introduced into the epitaxial layer, a highly doped layer of the second conductivity type provided at a surface of the layer of the second conductivity type, and a plurality of floating Schottky contact metal layers provided vertically stacked in at least one trench region and disposed mutually in parallel and parallel to the highly doped substrate, and configured between the layer of the second conductivity type and the highly doped substrate of the first conductivity type, wherein each floating Schottky contact metal layer is isolated from one another by at least one intervening dielectric layer, and wherein each floating Schottky contact metal layer at least laterally contacts the epitaxial layer of the first conductivity type to form a non-ohmic Schottky contact, and wherein, at the surface of the layer of the second conductivity type, a highly doped layer of the first conductivity type and a highly doped layer of the second conductivity type are provided, at least two trenches filled with doped polysilicon and covered with dielectric layers are introduced into the epitaxial layer, the dielectric layers forming bottoms of the trenches are dimensioned to be thicker than the dielectric layers at side walls of the trenches, and an alternating sequence of the floating Schottky contact metal layers and the at least one intervening dielectric layer is provided below the dielectric layer forming the bottom of the respective trench.

* * * * *